(12) United States Patent
Suzuki et al.

(10) Patent No.: US 9,588,140 B2
(45) Date of Patent: Mar. 7, 2017

(54) INSPECTION PROBE AND AN IC SOCKET WITH THE SAME

(71) Applicant: YAMAICHI ELECTRONICS CO., LTD., Tokyo (JP)

(72) Inventors: Katsumi Suzuki, Tokyo (JP); Yuji Nakamura, Tokyo (JP); Takeyuki Suzuki, Tokyo (JP); Yukio Ota, Kamiina-gun (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 108 days.

(21) Appl. No.: 14/188,272

(22) Filed: Feb. 24, 2014

(65) Prior Publication Data

US 2014/0253163 A1   Sep. 11, 2014

(30) Foreign Application Priority Data

Mar. 1, 2013   (JP) .................................. 2013-040819

(51) Int. Cl.
*G01R 1/073* (2006.01)
*G01R 1/067* (2006.01)

(52) U.S. Cl.
CPC ..... *G01R 1/06722* (2013.01); *G01R 1/06733* (2013.01)

(58) Field of Classification Search
CPC . G01R 1/06722; G01R 1/06733; G01R 1/067
(Continued)

(56) References Cited

U.S. PATENT DOCUMENTS 6,248,656 B1 * 6/2001 Baker ................. H01L 21/4857
438/121
6,424,166 B1 * 7/2002 Henry .................. G01R 1/0483
324/754.08
(Continued)

FOREIGN PATENT DOCUMENTS

JP        2002031648 A *  1/2002  ............. G01R 1/067
JP    A-2006-266869      10/2006
(Continued)

OTHER PUBLICATIONS

Hemmi, Akihiko; Contact Head, Probe Pin With the Contact Head, and Electrical Connection Device Using the Probe Pin; Publication Date Dec. 29, 2011; WIPO Patentscope Google Translation.*

*Primary Examiner* — Melissa Koval
*Assistant Examiner* — Rahul Maini
(74) *Attorney, Agent, or Firm* — Oliff PLC

(57) ABSTRACT

An inspection probe 16Ai is formed by subjecting a thin sheet material made of a copper alloy to press working. The inspection probe 16Ai includes: a device side plunger 16A having a contact point which selectively comes into contact with an electrode portion DVb of a semiconductor device DV; a board side plunger 16B having a contact point which selectively comes into contact with a contact pad of a printed wiring board 18; a spring portion 16D which biases the device side plunger 16A and the board side plunger 16B in a direction away from each other; and a cylindrical support stem 16C being disposed inside the spring portion 16D, making the spring portion 16D slidable thereon, and being configured to retain straight advancing property of the spring portion 16D.

13 Claims, 10 Drawing Sheets

(58) Field of Classification Search
USPC .............. 324/754–755.11; 439/66, 700
See application file for complete search history.

(56) References Cited

U.S. PATENT DOCUMENTS

| | | | | |
|---|---|---|---|---|
| 6,462,567 | B1 * | 10/2002 | Vinther | G01R 1/06722 324/755.05 |
| 6,908,347 | B2 * | 6/2005 | Sasaki | H01R 13/2421 439/66 |
| 7,381,062 | B2 * | 6/2008 | Shimada | G01R 1/06722 439/66 |
| 7,677,901 | B1 | 3/2010 | Suzuki et al. | |
| 8,591,267 | B2 * | 11/2013 | Hemmi | G01R 1/06722 439/700 |
| 2008/0100325 | A1 * | 5/2008 | Sinclair | G01R 1/06722 324/755.05 |

FOREIGN PATENT DOCUMENTS

| | | | | |
|---|---|---|---|---|
| JP | A-2010-157386 | | 7/2010 | |
| JP | 2011226887 | A | 11/2011 | |
| JP | 2011227035 | A | 11/2011 | |
| JP | WO 2011161855 | A1 * | 12/2011 | ......... G01R 1/06722 |
| JP | 2012-107970 | A | 6/2012 | |
| KR | 2011-0018245 | A | 2/2011 | |
| KR | WO 2012169831 | A2 * | 12/2012 | ......... G01R 1/07357 |
| KR | 2014-0026736 | A | 3/2014 | |

* cited by examiner

INSPECTION PROBE AND AN IC SOCKET WITH THE SAME

CROSS-REFERENCES TO RELATED APPLICATIONS

This application claims the benefit of Japanese Patent Application No. 2013-040819, filed Mar. 1, 2013, which is hereby incorporated by reference herein in its entirety.

BACKGROUND OF THE INVENTION

Field of the Invention

The present invention relates to an inspection probe and an IC socket with the same.

Description of the Related Art

On a semiconductor device serving as an electronic device to be mounted on electronic equipment or the like, a test for eliminating a potential failure is generally performed by use of a semiconductor device socket at a stage before the device is mounted. The semiconductor device socket used for the test or the mounting is generally referred to as an IC socket (integrated circuit socket), which is disposed on a printed wiring board (a test board or a mounting board) as disclosed in Japanese Patent Laid-Open No. 2010-157386, for example. In the IC socket, a plurality of inspection probes (which are referred to as contacts in Japanese Patent Laid-Open No. 2010-157386) for electrically connecting the above-mentioned semiconductor device to the printed wiring board are provided in a base member.

As shown in FIG. 1 in Japanese Patent Laid-Open No. 2010-157386, for example, an inspection probe comprises: a plunger provided with multiple plate-like contact pieces which come into contact with an electrode of a semiconductor device; and a coil spring unit configured to bias the plunger. The plunger is formed by pressing a thin sheet made of a copper alloy. Moreover, the coil spring unit is formed from a stainless steel wire or a piano wire, and comprises: a spring portion into which a lower part of the plunger is inserted; and a wound tight portion which is continuous with the spring portion.

A reduction in a resistance value of the coils spring unit is essential to the above-described inspection probe in order for transmitting an electric signal from the plunger via the coil spring unit. Thus, in a quest to reduce the resistance value, the wound tight portion of the coil spring unit is brought into close contact. Alternatively, as a surface treatment of the coils spring unit, thickening plating is performed on the coil spring unit by using a material having a relatively low resistance value such as gold (Au), copper (Cu), and silver (Ag).

Moreover, as shown in FIG. 10 in Japanese Patent Laid-Open No. 2006-266869, there is also proposed an inspection probe in which upper and lower contact portions, a spring portion, and a short-circuit piece are integrally formed in order to reduce the number of components and to secure large expansion and contraction amounts. The short-circuit piece is configured such that its lower end portion does not come into contact with the lower contact portion when the spring portion is not compressed and such that the lower end portion comes into contact with the lower contact portion when the spring portion is compressed. Herewith, conduction is established between the upper contact portion and the lower contact portion through the short-circuit piece.

SUMMARY OF THE INVENTION

According to Japanese Patent Laid-Open No. 2010-157386, because the material of the coil spring unit used in the above-described inspection probe is most commonly a piano wire or a stainless steel wire to meet demands for load bearing and durability, there are limitations in improving the reduction in the resistance value of the coil spring unit by use of the plated membrane alone. At that time, the work of subjecting the coil spring units to the relatively thickening plating may also develop a manufacturing problem that the coil spring units are apt to fix together in the plating process. Moreover, the shortening of a flow path by use of the wound tight portion may be unstable and is not suitable for large-current use exceeding 3 (A) in particular.

In addition, the above-mentioned inspection probe has a fixing portion which is located at a lower part of the plunger and is inserted into an end portion of the spring portion and holds the spring portion. When the plunger and the coil spring unit are assembled together, since dimensional adjustment of a clearance between the fixing portion and the end portion of the spring portion is required, from the viewpoint of improving productivity, it is desirable to omit such a dimensional adjustment procedure.

In Japanese Patent Laid-Open No. 2006-266869, it is not easy to achieve proper positioning of the upper contact portion because the spring portion of the inspection probe has a strength problem that it is weak against a force in a direction orthogonal to the center axis of the inspection probe. Moreover, when the spring portion is compressed, the spring portion may buckle significantly because the short-circuit piece does not coincide with the center axis of the spring portion. Furthermore, since a lower end portion of the short-circuit piece is configured to come into contact with the lower contact portion at one point, this configuration is accompanied by problems of instabilities in internal contact, internal slide, and internal resistance value due to a change in contact load when the inspection probe is tilted.

In view of the above-described mentioned problem, the present invention aims to provide an inspection probe and an IC socket with the same. The inspection probe and an IC socket with the same can reliably and stably reduce a resistance value of a transmission path to transmit an electric signal and avoid buckling of a spring portion, and are also suitable for large-current use.

For the purpose of achieving the foregoing object, an inspection probe according to the present invention comprises: a first plunger formed from a copper alloy material, and including a contact point configured to selectively come into contact with an electrode portion of an object to be inspected; a second plunger formed from the copper alloy material, and including a contact point configured to selectively come into contact with an electrode portion of a wiring board; a spring portion formed integrally with one end of the first plunger and one end of the second plunger, and configured to bias the first plunger and the second plunger in a direction away from each other; and a support stem formed into a cylindrical shape integrally with the other end of the second plunger in such a manner as to be disposed inside the spring portion with a predetermined clearance in between, and configured to slidably guide the spring portion. The inspection probe is characterized in that when the contact point of the first plunger comes into contact with the electrode portion of the object to be inspected, one end of the support stem comes into sliding contact with an inner peripheral portion of the first plunger.

In addition, another end of the support stem having a pair of elastic contact pieces on one end, may form the contact point of the second plunger. The predetermined clearance between an inner peripheral portion of the spring portion and an outer peripheral portion of the support stem may be set in such a manner as to retain straight advancing property of the spring portion. The cross-sectional shape of the spring portion along a longitudinal section of the support stem may be formed into a rectangular shape. The contact point of the first plunger may include at least three projections located on a common circumference. The contact point of the second plunger may be spherical.

Furthermore, the first plunger, the second plunger, the spring portion, and the support stem may be formed by subjecting a common plate-shaped blank to bending work.

Moreover, another inspection probe according to the present invention comprises: a first plunger formed from a copper alloy material, and including a contact point configured to selectively come into contact with an electrode portion of an object to be inspected; a second plunger formed from the copper alloy material, and including a contact point configured to selectively come into contact with an electrode portion of a wiring board; a spring portion formed integrally with one end of the first plunger and one end of the second plunger, and configured to bias the first plunger and the second plunger in a direction away from each other; and a support stem formed into a cylindrical shape integrally with the other end of the second plunger in such a manner as to be disposed inside the spring portion with a predetermined clearance in between, and configured to slidably guide the spring portion. When the contact point of the first plunger comes into contact with the electrode portion of the object to be inspected, one end of the support stem may come into sliding contact with an inner peripheral portion of the first plunger. The first plunger, the second plunger, and the spring portion may be shaped by subjecting a common plate-shaped blank made of the copper alloy to bending work and then to a plating process with a non-magnetic metal. In addition, the non-magnetic metal may include at least gold or copper. The plating process may be performed in such a way as to form a first layer of copper in a film thickness of 0.05 to 1 μm on a surface of a base metal made of the copper alloy, and then to stack a second layer of gold in a film thickness of 0.1 to 5 μm on the first layer. Otherwise, the plating process is performed in such a way as to form only a single layer of gold in a film thickness of 0.1 to 5 μm on a surface of a base metal made of the copper alloy.

What is more, an IC socket according to the present invention includes: multiple of the inspection probes; a probe accommodating portion configured to accommodate the inspection probes; and a semiconductor device mounting portion configured to attachably and detachably accommodate a semiconductor device provided with multiple of the electrode portions with which the contact points of the inspection probes come into contact; and the housing disposed on a wiring board to be electrically connected to the inspection probes.

According to the inspection probe of the present invention and the IC socket with the same, the inspection probe includes: the first plunger formed from a copper alloy material, and including the contact point configured to selectively come into contact with the electrode portion of the object to be inspected; the second plunger formed from the copper alloy material, and including the contact point configured to selectively come into contact with the electrode portion of the wiring board; the spring portion formed integrally with the one end of the first plunger and the one end of the second plunger, and configured to bias the first plunger and the second plunger in the direction away from each other; and the support stem formed into a cylindrical shape integrally with the other end of the second plunger in such a manner as to be disposed inside the spring portion with the predetermined clearance in between, and configured to slidably guide the spring portion. Thus, the inspection probe prevents the spring portion from bucking, reduces a resistance value of a transmission path to transmit an electric signal, and is suitable for large-current use. In addition, when the contact point of the first plunger comes into contact with the electrode portion of the object to be inspected, the one end of the support stem comes into sliding contact with the inner peripheral portion of the first plunger. This makes it possible to stabilize internal resistance, and thereby to reliably and stably reduce the resistance value of the transmission path.

Further features of the present invention will become apparent from the following description of exemplary embodiments (with reference to the attached drawings).

DESCRIPTION OF THE EMBODIMENTS

Figure 3:
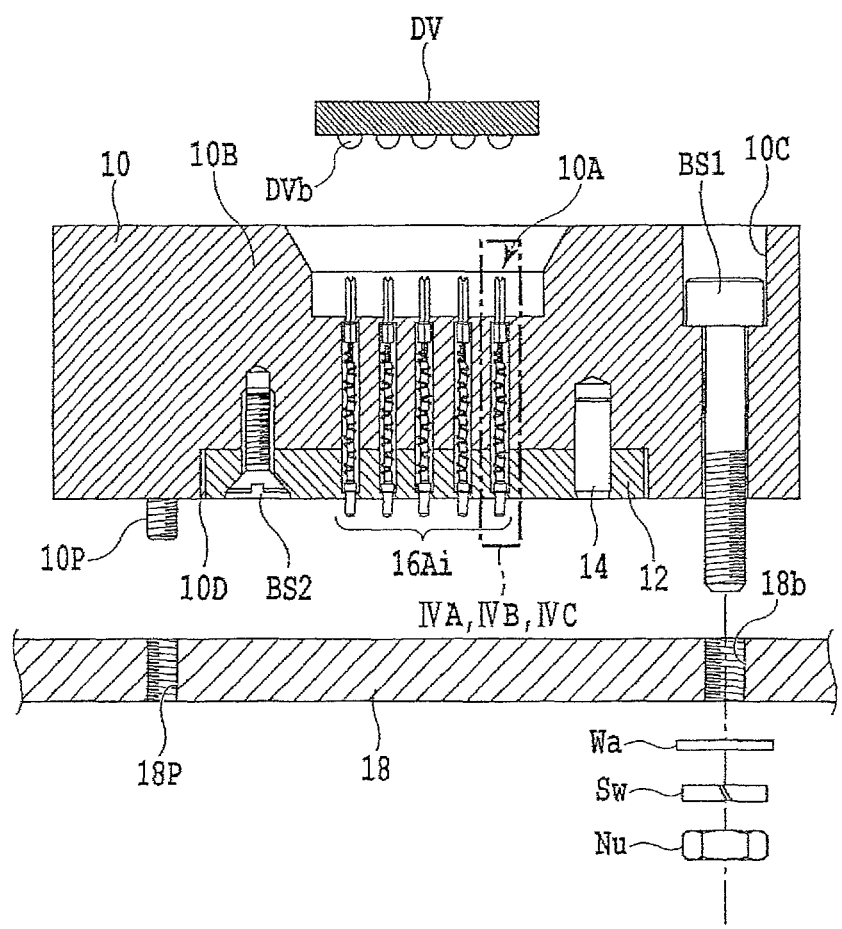
FIG. 3 is a configuration diagram schematically showing a configuration of an example of an IC socket according to the present invention.

FIG. 3 schematically shows a configuration of an example of an IC socket according to the present invention.

In FIG. 3, a plurality of IC sockets are disposed on a mounting surface of a given printed wiring board 18. Note that FIG. 3 typically illustrates one of the IC sockets. The IC socket is configured to electrically connect contact pads formed on the mounting surface of the printed wiring board (a test board) 18 to electrode portions DVb of a semiconductor device DV which is to be attached as an object to be inspected. The semiconductor device DV is provided with an integrated circuit disposed in a BGA (Ball Grid Array) package, for example. The multiple electrode portions DVb (see FIG. 3 and FIG. 4C) are formed in a matrix on a bottom portion of the semiconductor device DV. Note that the semiconductor device is not limited only to the BGA packaged device but may also be an LGA (Land Grid Array) packaged device, for instance.

The printed wiring board 18 is made of glass epoxy resin, for example. A group of electrodes (not shown), which comprises multiple contact pads formed into in a lattice-like corresponding to a layout of inspection probes 16Ai (i=1 to n, n is a positive integer) to be described later, are provided substantially in the central part on one of surface portions of the printed wiring board 18. Through-holes 18b into which machine screws BS1 to be described later are inserted are formed at four positions around the group of electrodes.

The IC socket is fixed to the mounting surface of the printed wiring board 18 by being fastened with the four machine screws BS1 to be inserted into the above-mentioned through-holes 18b and through-holes 100 to be described later, and four sets of nuts Nu, plain washers Wa, and spring washers SW.

The IC socket comprises, as main constituents: the above-described multiple inspection probes 16Ai; and a housing 10 and a lower plate 12 which cooperate to accommodate the inspection probes 16Ai inside.

The housing 10 is made of an insulative material such as a plastic, and has a recessed semiconductor device mounting portion 10A which is located at the center of an upper part thereof as shown in FIG. 3. The semiconductor device mounting portion 10A is configured to attachably and detachably accommodate the electrode portions DVb of the semiconductor device DV, and to locate each electrode portion DVb of the semiconductor device DV at position of contact point of each inspection probe 16Ai. The semiconductor device DV is positioned by fitting its outer peripheral portion into an inner peripheral portion of the semiconductor device mounting portion 10A. The contact points of the inspection probes 16Ai project from a bottom portion of the semiconductor device mounting portion 10A.

The inspection probes 16Ai are respectively inserted into multiple through-holes 10bi (i=1 to n, n is the positive integer) in a probe accommodating portion 10B that forms a lower section of the semiconductor device mounting portion 10A. As shown in the enlarged view of FIG. 4A, each through-hole 10bi is formed in such a manner that one end thereof is opened to the bottom portion of the semiconductor device mounting portion 10A while the other end thereof is opened to a lower plate attachment portion 10D into which the lower plate 12 to be described later is fitted. The through-hole 10bi is formed from: a large-diameter portion which accommodates a lower part of a device side plunger 16A, a spring portion 16D, and a support stem portion 16C of the inspection probe 16Ai; and a small-diameter portion 10d being continuous with the large-diameter portion and allowing an upper part of the device side plunger 16A to pass therethrough. Hereby, a stepped portion is formed at a boundary part between the large-diameter portion and the small-diameter portion 10d.

The through-holes 100 into which the machine screws BS1 are inserted are formed at four positions at corners around the semiconductor device mounting portion 10A.

In addition, the lower plate 12 is attached to the lower plate attachment portion 10D that is formed in a lower end portion of the housing 10 immediately below the semiconductor device mounting portion 10A. As shown in FIG. 3, a positioning pin 14 fixed to the housing 10 is fitted into a positioning hole in the lower plate 12, and the lower plate 12 is thereby positioned relative to the lower plate attachment portion 10D. Moreover, a flat head machine screw BS2 is screwed through a hole in the lower plate 12 into a female screw hole in the housing 10 located above the lower plate attachment portion 10D, and the lower plate 12 is thereby fixed to the lower plate attachment portion 10D.

Figure 4A:
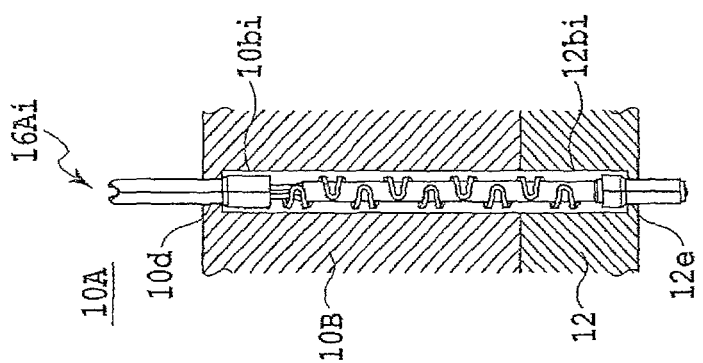
FIG. 4A, FIG. 4B, and FIG. 4C are, respectively, cross-sectional views of part A of the IC socket made available for explanation of an operation of the inspection probe of the example shown in FIG. 3.

As shown in the enlarged view of FIG. 4A, the plate-shaped lower plate 12 has a plurality of through-holes 12bi (i=1 to n, n is the positive integer) corresponding to the multiple through-holes 10bi. Each through-hole 12bi is formed from: a large-diameter portion which accommodates an upper part of a board side plunger 16B, part of the spring portion 16D, and part of the support stem portion 16C of the inspection probe 16Ai; and a small-diameter portion 12e being continuous with the large-diameter portion and allowing a lower part of the board side plunger 16B to pass therethrough. Herewith, a stepped portion is formed at a boundary part between the large-diameter portion and the small-diameter portion 12e. The diameter of the large-diameter portion of the through-hole 12bi is set substantially equal to the diameter of the large-diameter portion of the corresponding through-hole 10bi.

As shown in FIG. 3, a positioning pin 10P to be fitted into a positioning hole 18P in the printed wiring board 18 is provided around the lower plate attachment portion 10D of the housing 10.

Figure 1:
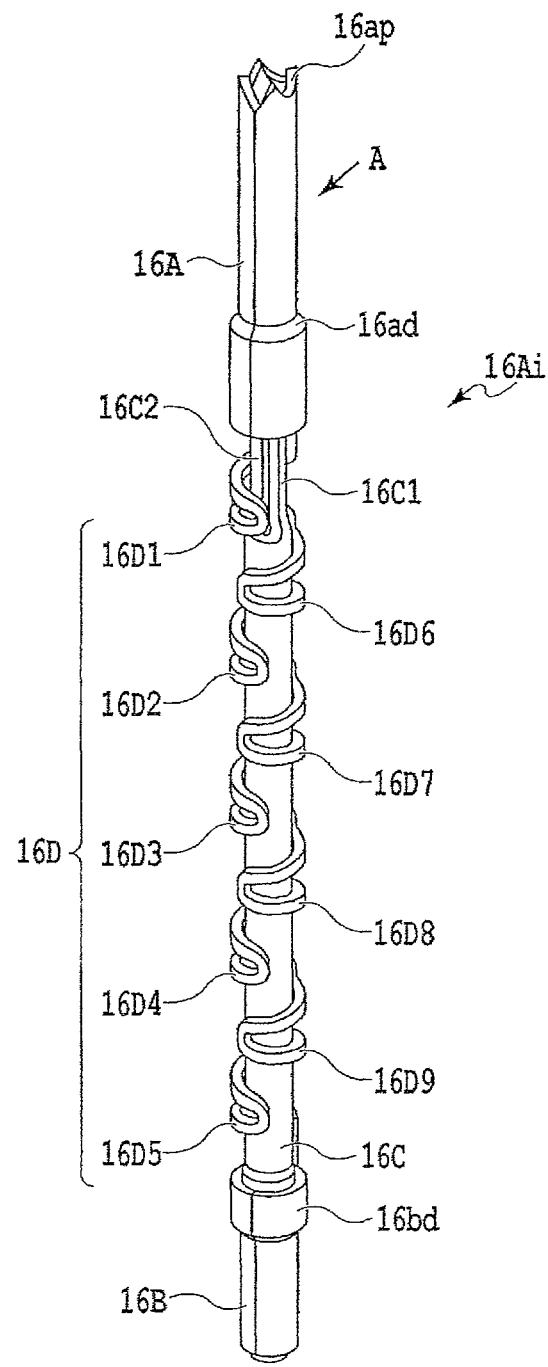
FIG. 1 is a perspective view showing an external appearance of an example of an inspection probe according to the present invention.

As shown in the enlarged view of FIG. 1, each inspection probe 16Ai comprises: the device side plunger 16A serving as a first plunger having the contact points that selectively come into contact with the corresponding electrode portion DVb of the semiconductor device DV; the board side plunger 16B having the contact point that selectively comes into contact with the corresponding contact pad of the printed wiring board 18; the spring portion 16D which biases the device side plunger 16A and the board side plunger 16B in a direction away from each other; and the cylindrical support stem 16C being disposed inside the spring portion 16D, making the spring portion 16D slidable thereon, and being configured to retain straight advancing property of the spring portion 16D.

Each inspection probe 16Ai is integrally formed from a thin sheet material made of a copper alloy as a non-magnetic metal and in accordance with a series of press working processes. The thin sheet material made of the copper alloy may be phosphor bronze or beryllium copper, for example. After the formation, the inspection probe 16Ai undergoes a plating processing using one or more metals or an alloy of the metals selected from a group of non-magnetic metals. The group of non-magnetic metals comprises gold, silver, copper, palladium, rhodium, iridium, and platinum, for example. The plating processing is performed, for example, in such a way as to form a first layer of copper in a film thickness of 0.05 to 1 μm on a surface of a base metal made of a copper alloy, and then to stack a second layer of gold in a film thickness of 0.1 to 5 μm on the first layer. Note that the plating processing is not limited only to the foregoing example, For instance, only a single layer of gold may be formed in a film thickness of 0.1 to 5 μm on a surface of the base metal made of the copper alloy.

Figure 5A:
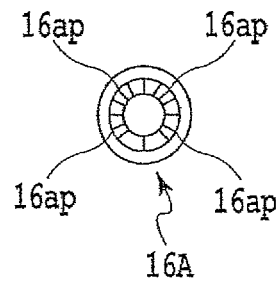
FIG. 5A and FIG. 5B are, respectively, a top view and a bottom view of the example shown in FIG. 1.
Figure 5B:
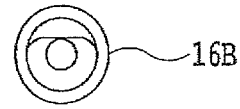

As shown in FIG. 5A, the device side plunger 16A is shaped like a different diameter pipe, and one end thereof has four contact points 16ap which are pointed projections located on a common circumference. As shown in the enlarged view of FIG. 7A, the cylindrical device side plunger 16A has in its inside, a small-diameter portion 16ac whose one end is provided with the above-described contact points 16ap, and a large-diameter portion 16ae which is continuous with the small-diameter portion 16ac. A stepped portion 16ad is formed in an outer peripheral portion of the device side plunger 16A corresponding to a boundary between the small-diameter portion 16*ac* and the large-diameter portion 16*ae*. The stepped portion 16*ad* is engaged with the stepped portion of the through-hole 10*bi* in the probe accommodating portion 10B described above when the inspection probe 16Ai is attached into the through-hole 10*bi*. An end portion of the large-diameter portion 16*ae* of the device side plunger 16A is integrally connected to an end of a curved portion 16D1 of the spring portion 16D. It is to be noted that the number of the pointed projections of the contact points 16*ap* is not limited to the above-mentioned example, the number of the pointed projections to be formed may be two, or five or more, at least three pointed projections should preferably be provided.

Figure 5C:
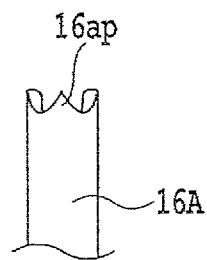
FIG. 5C is a front view which is viewed in the direction indicated with an arrow A in FIG. 1.

As shown in the enlarged view of FIG. 1 and FIG. 5C, the board side plunger 16B serving as a second plunger is shaped like a different diameter pipe, and one end thereof includes a contact point formed like a double-pipe. As shown in the enlarged view of FIG. 7A, the board side plunger 16B has in its inside, a small-diameter portion whose outer peripheral portion on one end is provided with the above-mentioned spherical contact point, and a large-diameter portion which is continuous with the small-diameter portion. A stepped portion 16*bd* is formed in an outer peripheral portion of the board side plunger 16B corresponding to a boundary between the small-diameter portion and the large-diameter portion. The stepped portion 16*bd* is engaged with the stepped portion of the through-hole 12*bi* in the lower plate 12 described above when the inspection probe 16Ai is attached into the through-hole 10*bi*. An end portion of the large-diameter portion of the board side plunger 16B is integrally connected to an end of a curved portion 16D5 of the spring portion 16D. Since the small-diameter portion has the spherical contact point, the contact pad on the wiring board is prevented from damage at the time of contact.

Figure 7A:
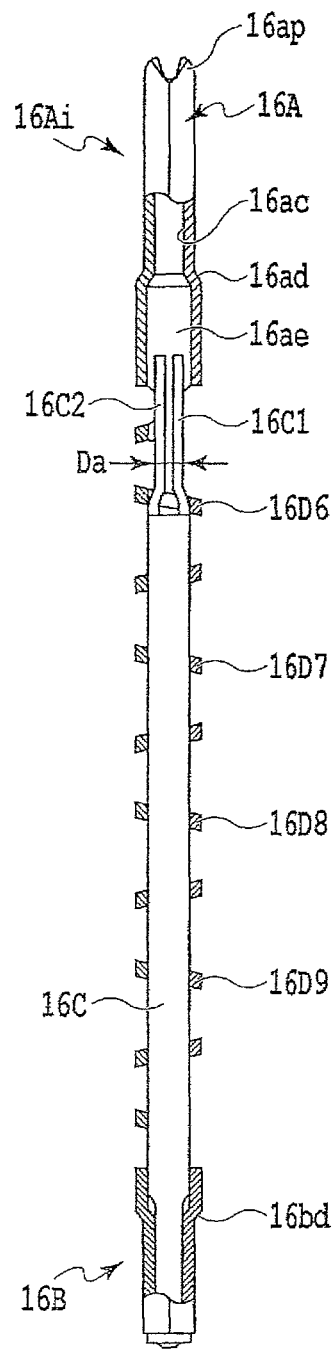
FIG. 7A is a cross-sectional view of the example shown in FIG. 1.
Figure 7B:
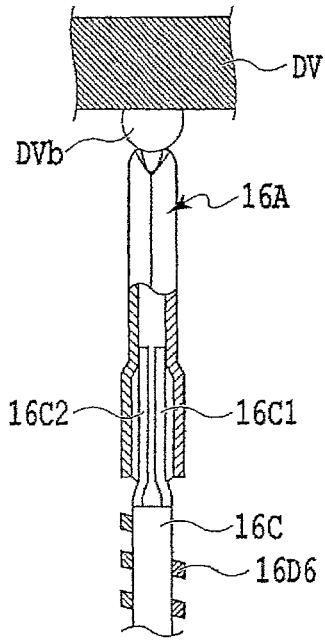
FIG. 7B is a partial cross-sectional view made available for explanation of an operation of the example shown in FIG. 1.
Figure 7C:
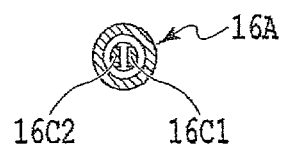
FIG. 7C is a partial cross-sectional view showing a part in FIG. 7B.

As shown in the enlarged view of FIG. 7A, the cylindrical support stem 16C is disposed between the inside of the large-diameter portion 16*ae* of the device side plunger 16A and the inside of the large-diameter portion as well as the small-diameter portion of the board side plunger 16B. As shown in FIG. 7C, one end of the support stem 16C has a pair of contact pieces 16C1 and 16C2 that face each other with a given clearance in between. Each of the pair of contact pieces 16C1 and 16C2 has a substantially semicircular cross-sectional shape and is made elastically displaceable in a radial direction of the support stem 16C. As shown in the enlarged view of FIG. 7A, FIG. 7B, and FIG. 7C, a diameter Da of contact pieces 16C1 and 16C2 is set to a diameter smaller than a diameter of an intermediate portion of the support stem 16C, for example, and to come into slidably contact at a given pressure with an inner peripheral portion of the small-diameter portion 16*ac* of the device side plunger 16A. As described later, by swaging the large-diameter portion and the small-diameter portion of the board side plunger 16B, the other end of the support stem 16C is fitted into the large-diameter portion and the small-diameter portion of the board side plunger 16B.

Figure 2:
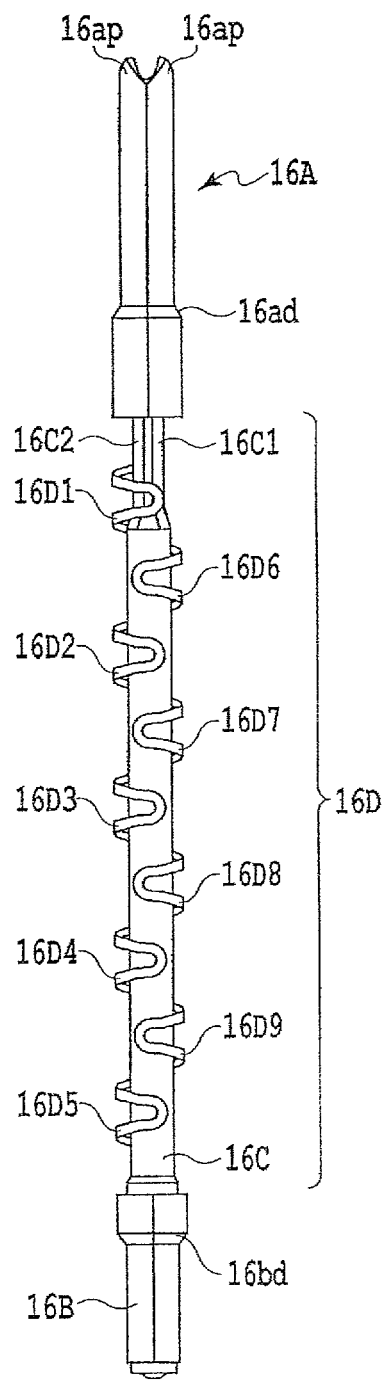
FIG. 2 is a front view of the example shown in FIG. 1.
Figure 6:
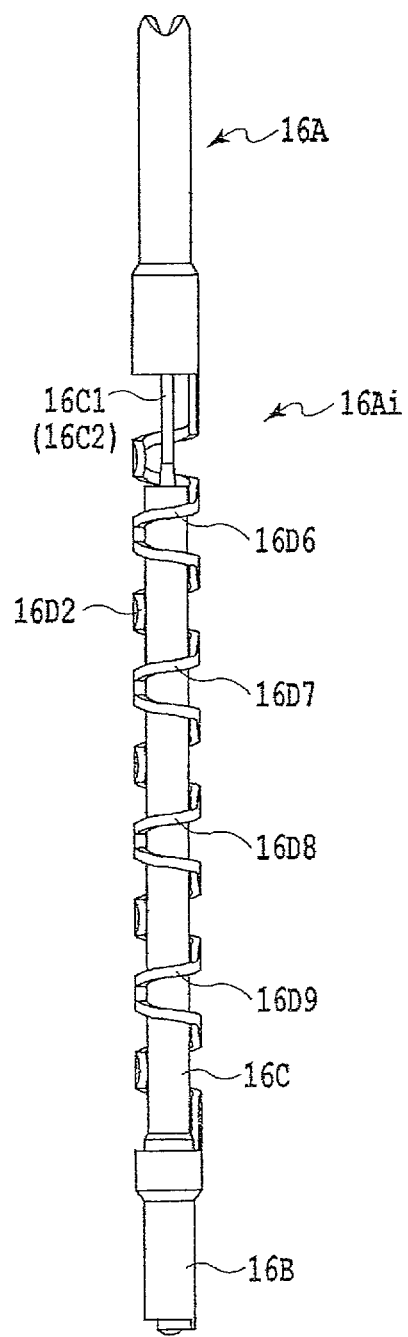
FIG. 6 is a side view of the example shown in FIG. 1.

As shown in the enlarged view of FIG. 2, the helical spring portion 16D is wound with a predetermined clearance around an outer peripheral portion of the support stem 16*0*. The center axis of the spring portion 16D substantially coincides with the center axis of the support stem 16C. The predetermined clearance is set in such a manner as to retain straight advancing property of the sliding spring portion 16D as described later. The spring portion 16D has curved portions 16D1, 16D2, 16D3, 16D4, 16D5, 16D6, 16D7, 16D8, and 16D9, which are connected together and arranged in a staggered manner along the center axis of the support stem 16C. Hereby, a bent part of the curved portion 16D6 is formed between the curved portion 16D1 and the curved portion 16D2 with predetermined intervals. Moreover, as shown in the enlarged view of FIG. 6, a bent part of the curved portion 16D2 is formed between the curved portion 16D6 and the curved portion 16D7 with predetermined intervals. Moreover, each of the curved portions 16D1 to 16D9 is formed substantially in a rectangular cross-sectional shape, and therefore has a larger torsional rigidity (G·Ip) (G: elastic shear modulus, Ip: polar second moment of area) and a larger spring constant than when formed in a circular cross-sectional shape.

Figure 4B:
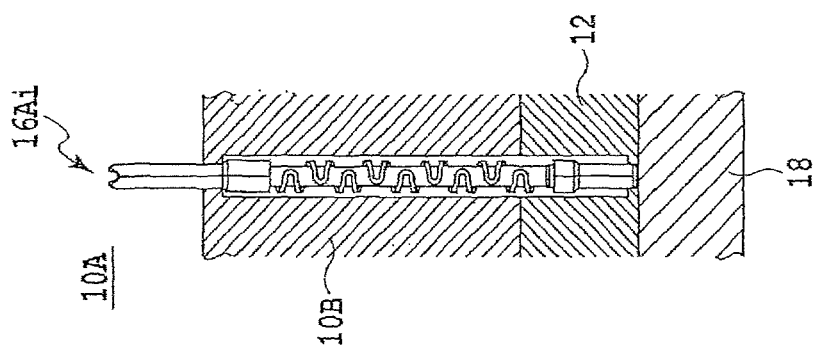
Figure 4C:
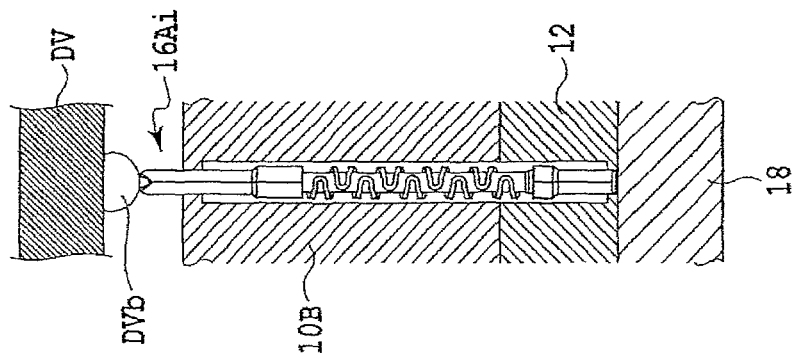

Here, the curved portions 16D1 to 16D9 are formed to be capable of coming close to and moving away from one another in response to movements of the device side plunger 16A and the board side plunger 16B. Accordingly, as shown in FIGS. 4A to 4C, the spring portion 16D is made expandable and contractible along the center axis of the support stem 16C, and is configured to bias the device side plunger 16A and the board side plunger 16B in the direction away from each other.

Although the above-described spring portion 16D has the nine curved portions, the present invention is not limited only to this example, for instance, the number of the curved portions may be increased or decreased in accordance with contact pressures deemed to be necessary for the contact points of the device side plunger 16A and the board side plunger 16B. Alternatively, the shape of each curved portion may be changed.

In the above-described configuration, each inspection probe 16Ai is attached into one of the multiple through-holes 10*bi* in the probe accommodating portion 10B of the housing 10 and into the corresponding through-hole 12*bi* in the lower plate 12 as shown in FIG. 4A. Thereafter, the IC socket is fixed to the mounting surface of the printed wiring board 18 as shown in FIG. 4B. At that time, the contact point of the board side plunger 16B is forced into the through-hole 12*bi* in the lower plate 12 against the biasing force of the spring portion 16D by the contact pad on the printed wiring board 18. Then, when the semiconductor device DV is positioned and attached to the inner peripheral portion of the semiconductor device mounting portion 10A, with the contact points 16*ap* of the device side plunger 16A coming into contact with the electrode portion DVb of the semiconductor device DV as shown in FIG. 4C, part of the device side plunger 16A is pushed into the through-hole 10*bi* in the probe accommodating portion 10B. At that time, as shown in the enlarged view of FIGS. 7B and 7C, because the pair of contact pieces 16C1 and 16C2 of the support stem 16C come into sliding contact at the given pressure with the inner peripheral portion of the small-diameter portion 16*ac* of the device side plunger 16A, the contact points 16*ap* of the device side plunger 16A are electrically connected to the electrode portion DVb, and the contact point of the board side plunger 16B is electrically connected to the contact pad, each at the shortest distance along the center axis of the support stem 16C. Herewith, the inspection probe 16Ai can reliably and stably reduce a resistance value of a transmission path to transmit an electric signal. In addition, since the inspection probe 16Ai as a whole is supported by the support stem 16C, the spring portion 16D is prevented from buckling. Furthermore, the inspection probe 16Ai is suitable for large-current use.

Moreover, the example of the inspection probe 16Ai according to the present invention is integrally formed from a copper alloy material as a non-magnetic metal, and its surface is subjected to the plating process with a non-magnetic metal. Since an iron-based magnetic material such as a piano wire or a stainless steel wire has conventionally been used as a coil spring material to meet demands for load bearing, durability, and the like, an inspection probe using the iron-based magnetic material cannot be used in an apparatus for inspecting a magnetic sensor such as an acceleration sensor and a gyro sensor, for example, because the inspection probe generates a magnetic field that impedes the inspection. This example can also solve this problem which the inspection probe using the iron-based magnetic material cannot be used in the apparatus.

Figure 8D:
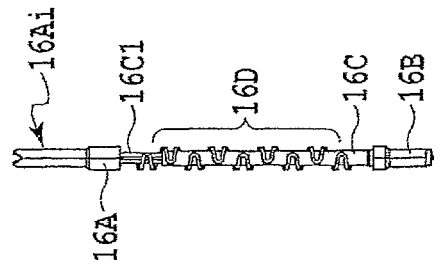
FIG. 8A, FIG. 8B, FIG. 8C, and FIG. 8D are, respectively, views made available for explanation of a series of forming processes for the example shown in FIG. 1.
Figure 8C:
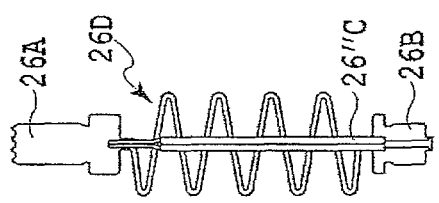
Figure 8B:
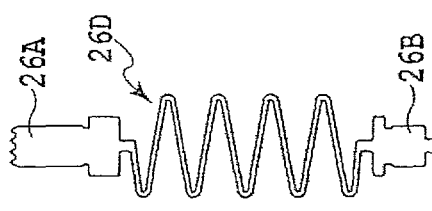
Figure 8A:
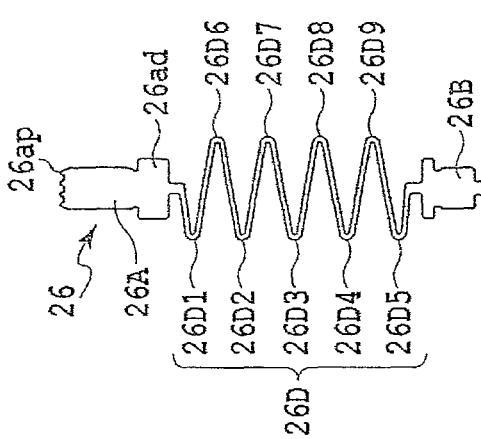

In order to manufacture the above-described inspection probe 16Ai, blanks 26 are integrally formed in the first place as shown in the enlarged view of FIG. 8A by blanking out a thin sheet material made of a copper alloy while using a given die. Note that FIG. 8A typically illustrates one blank 26 out of the multiple blanks formed at the same time.

Each blank 26 comprises: a portion 26D corresponding to the spring portion 16D, which connects a portion 26A and a portion 26B corresponding to the board side plunger 16B; the portion 26A corresponding to the device side plunger 16A of the inspection probe 16Ai; and a portion 26C corresponding to the support stem 16C, which is joined to the portion 26B through a connection piece 26Ct. An indented end portion 26ap that constitutes the contact points 16ap of the device side plunger 16A is formed at one end of the portion 26A. In addition, an expanded portion 26ad that forms the large-diameter portion 16ae is formed at the other end of the portion 26A.

The portion 26D has curved portions 26D1 to 26D9 which are connected together and correspond to the curved portions 16D1 to 16D9, respectively. One end of the portion 26B is connected to the curved portion 26D5 while the other end portion thereof is connected to one end of the connection piece 26Ct. The other end of the elongated connection piece 26Ct is connected to the portion 26C. An opposite end portion of the portion 26C is provided with a pair of projecting pieces 26C1 and 26C2 in parallel with a given clearance in between, which constitute the pair of contact pieces 16C1 and 16C2.

Next, as shown in FIG. 8B, the flat portion 26C is rolled into a cylindrical shape and is formed into a cylindrical portion 26'C that becomes the support stem. Hereby, the pair of projecting pieces 26C1 and 26C2 face each other.

Subsequently, as shown in FIG. 8C, the connection piece 26Ct is folded together with the cylindrical portion 26'C in such a manner that the connection piece 26Ct overlaps the portion 26B. Hereby, a support stem 26"C is formed in such a manner as to intersect and overlap the curved portions 26D1 to 26D9 of the portion 26D.

Then, as shown in FIG. 8D, the portion 26A and the portion 26D are bent into an elongated cylindrical shape. At that time, the curved portions 26D1 to 26D9 of the portion 26D are wound around an outer peripheral portion of the support stem 26"C with a predetermined clearance in between. Herewith, the inspection probe 16Ai is obtained in the shape as shown in FIG. 8D.

Figure 9A:
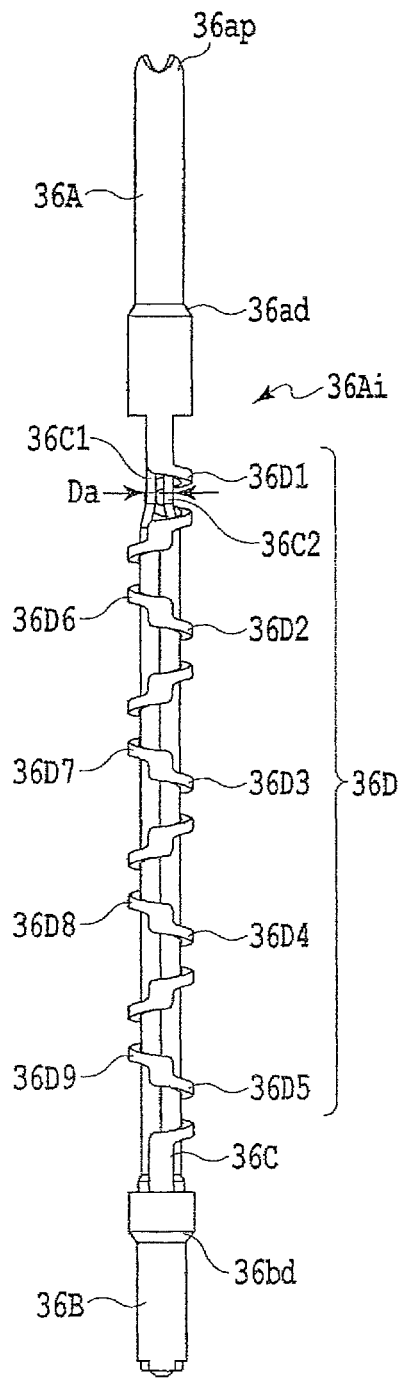
FIG. 9A is a view showing an external appearance of another example of the inspection probe according to the present invention.
Figure 9B:
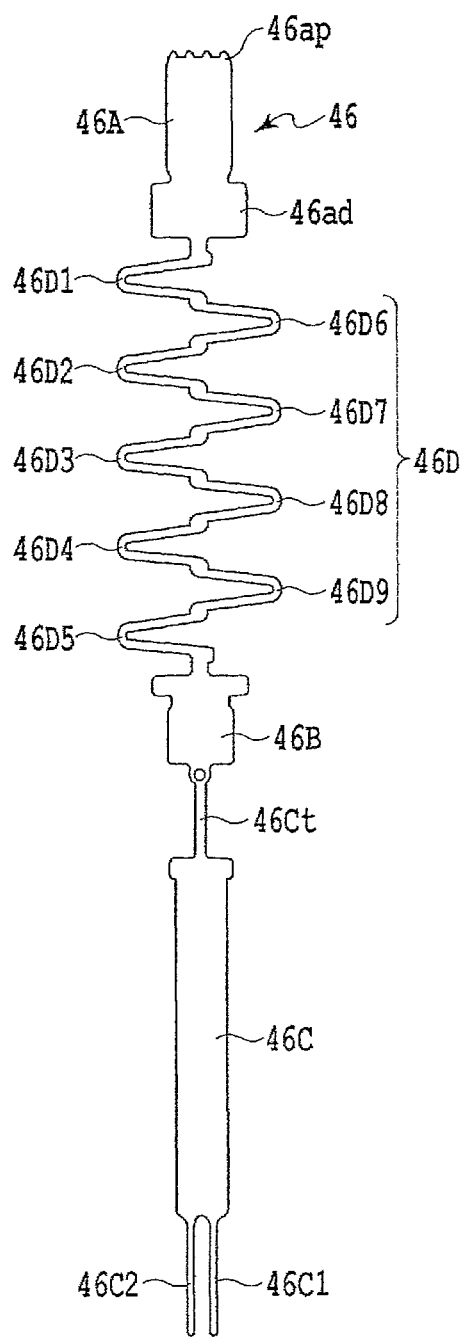
FIG. 9B is a view showing a blank used for formation of the example shown in FIG. 9A.

In the above-described example of the inspection probe according to the present invention, the spring portion 16D is formed by connecting the multiple curved portions 16D1 to 16D9 together, which have the equal width. However, the present invention is not limited only to this example. In order to adjust a spring load and durability of the spring portion and to adjust its straight advancing property at the time of displacement, for example, widths and cross-sectional shapes of connecting parts as well as the bent parts of the curved portions in the spring portion may be changed as shown in FIGS. 9A and 9B, and in FIGS. 10A and 10B. At that time, the width of each curved portion means a length of the curved portion taken in a direction orthogonal to a blanking direction in the case where the spring portion is formed by blanking out the thin sheet material.

Figure 10A:
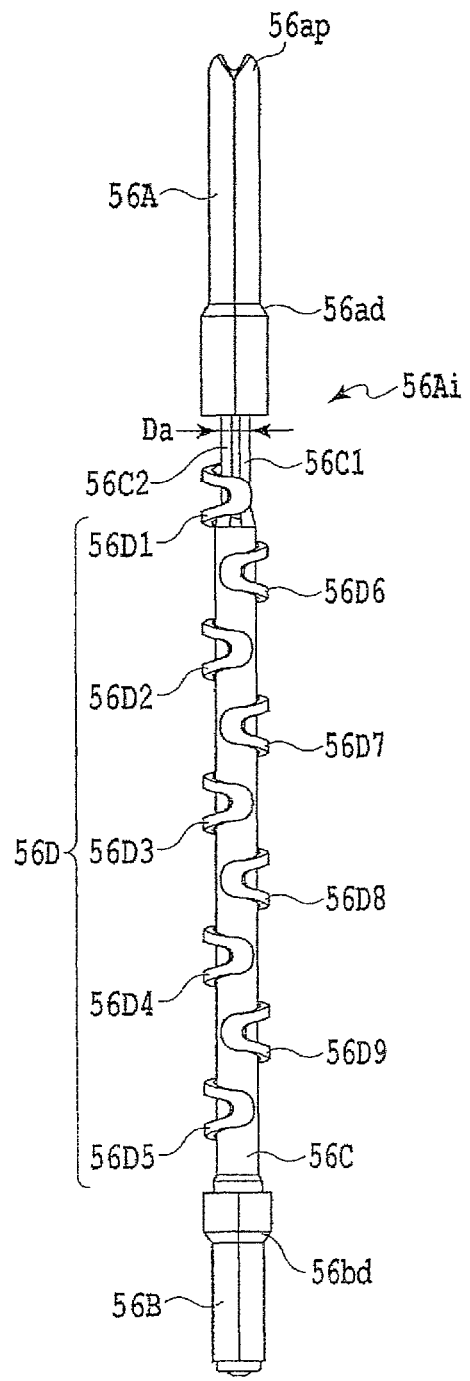
FIG. 10A is a view showing an external appearance of still another example of the inspection probe according to the present invention.

Each of the inspection probes shown in FIG. 9A and FIG. 10A is used in the IC socket shown in FIG. 3 and constitutes part of the IC socket.

As shown in the enlarged view of FIG. 9A, an inspection probe 36Ai comprises: a device side plunger 36A serving as a first plunger having contact points that selectively come into contact with the electrode portion DVb of the semiconductor device DV; a board side plunger 36B having a contact point that selectively comes into contact with the contact pad of the above-described printed wiring board 18; a spring portion 36D which biases the device side plunger 36A and the board side plunger 36B in a direction away from each other; and a cylindrical support stem 36C being disposed inside the spring portion 36D, making the spring portion 36D slidable thereon, and being configured to retain straight advancing property of the spring portion 36D.

The inspection probe 36Ai is integrally formed from a thin sheet material made of a copper alloy as a non-magnetic metal and in accordance with a series of press working processes. The thin sheet material made of a copper alloy may be phosphor bronze or beryllium copper, for example. After the formation, the inspection probe 16Ai undergoes a plating process using one or more metals or an alloy of the metals selected from a group of non-magnetic metals. The group of non-magnetic metals includes gold, silver, copper, palladium, rhodium, iridium, and platinum, for example. The plating process is performed, for example, in such a way as to form a first layer of copper in a film thickness of 0.05 to 1 μm on a surface of a base metal made of a copper alloy, and then to stack a second layer of gold in a film thickness of 0.1 to 5 μm on the first layer. Note that the plating process is not limited only to the foregoing example. For instance, only a single layer of gold may be formed in a film thickness of 0.1 to 5 μm on a surface of the base metal made of the copper alloy.

As shown in FIG. 9A, the device side plunger 36A is shaped like a different diameter pipe, and one end thereof includes four contact points 36ap which are pointed projections located on a common circumference. The cylindrical device side plunger 36A has in its inside, a small-diameter portion whose one end is provided with the above-mentioned contact points 36ap, and a large-diameter portion which is continuous with the small-diameter portion. The small-diameter portion and the large-diameter portion communicate with each other. A stepped portion 36ad is formed in an outer peripheral portion of the device side plunger 36A corresponding to a boundary between the small-diameter portion and the large-diameter portion. The stepped portion 36ad is engaged with the stepped portion of the through-hole 10bi in the probe accommodating portion 10B described above when the inspection probe 36Ai is attached into the through-hole 10bi in the housing 10 of the IC socket described above. An end portion of the large-diameter portion of the device side plunger 36A is integrally connected to an end of a curved portion 36D1 of the spring portion 36D.

The board side plunger 36B serving as a second plunger is shaped like a different diameter pipe, and one end thereof has a contact point formed like a double pipe. The board side plunger 36B has a small-diameter portion whose outer peripheral portion on one end is provided with the above-mentioned spherical contact point, and a large-diameter portion which is continuous with the small-diameter portion and located on an inner side. A stepped portion 36*bd* is formed in an outer peripheral portion of the board side plunger 36B corresponding to a boundary between the small-diameter portion and the large-diameter portion. The stepped portion 36*bd* is engaged with the stepped portion of the through-hole 12*bi* in the lower plate 12 described above when the inspection probe 36Ai is attached into the through-hole 10*bi*. An end portion of the large-diameter portion of the board side plunger 36B is integrally connected to an end of a curved portion 36D5 of the spring portion 36D.

The cylindrical support stem 36C is disposed between the inside of the large-diameter portion of the device side plunger 36A and the inside of the large-diameter portion as well as the small-diameter portion of the board side plunger 36B. One end of the support stem 36C has a pair of contact pieces 36C1 and 36C2 that face each other with a given clearance in between. Each of the pair of contact pieces 36C1 and 36C2 has a substantially semicircular cross-sectional shape and is made elastically displaceable in a radial direction of the support stem 36C. A diameter Da of contact pieces 36C1 and 36C2 is set to a diameter smaller than a diameter of an intermediate portion of the support stem 36C, for example, and to come into slidably contact at a given pressure with an inner peripheral portion of the small-diameter portion of the device side plunger 36A. As described later, by swaging the large-diameter portion and the small-diameter portion of the board side plunger 36B, the other end of the support stem 36C is fitted into the large-diameter portion and the small-diameter portion of the board side plunger 36B.

The helical spring portion 36D is wound with a predetermined clearance around an outer peripheral portion of the support stem 36C. The center axis of the spring portion 36D substantially coincides with the center axis of the support stem 36C. The predetermined clearance is set in such a manner as to retain straight advancing property of the sliding spring portion 36D as described later. The spring portion 36D includes curved portions 36D1, 36D2, 36D3, 36D4, 36D5, 36D6, 36D7, 36D8, and 36D9, which are connected together and arranged in a staggered manner along the center axis of the support stem 36C. Hereby, a bent part of the curved portion 36D6 is formed between the curved portion 36D1 and the curved portion 36D2 with predetermined intervals. A bent part of the curved portion 36D2 is formed between the curved portion 36D6 and the curved portion 36D7 with predetermined intervals. At that time, at a central part of a connecting part between one end of the curved portion 36D1 and one end of the curved portion 36D2, a bulge is formed in such a manner as to change the width of the connecting part. Similar bulges are formed at a central part of a connecting part between the other end of the curved portion 36D6 and one end of the curved portion 36D2, a central part of a connecting part between the other end of the curved portion 36D2 and one end of the curved portion 36D7, a central part of a connecting part between the other end of the curved portion 36D7 and one end of the curved portion 36D3, a central part of a connecting part between the other end of the curved portion 36D3 and one end of the curved portion 36D8, a central part of a connecting part between the other end of the curved portion 36D8 and one end of the curved portion 36D4, a central part of a connecting part between the other end of the curved portion 36D4 and one end of the curved portion 36D9, and a central part of a connecting part between the other end of the curved portion 36D9 and one end of the curved portion 36D5, respectively. Herewith, the bulges are formed substantially on a straight line along the center axis of the support stem 36C.

At that time, the curved portions 36D1 to 36D9 are formed to be capable of coming close to and moving away from one another in response to movements of the device side plunger 36A and the board side plunger 36B. Accordingly, the spring portion 36D is made expandable and contractible along the center axis of the support stem 36C, and is configured to bias the device side plunger 36A and the board side plunger 36B in the direction away from each other.

Although the above-described spring portion 36D includes the nine curved portions, the present invention is not limited only to this example. For instance, the number of the curved portions may be increased or decreased in accordance with contact pressures deemed to be necessary for the contact points of the device side plunger 36A and the board side plunger 36B. Alternatively, the shape of each curved portion may be changed.

In the above-described configuration, each inspection probe 36Ai is attached into one of the multiple through-holes 10*bi* in the probe accommodating portion 10B of the housing 10 and into the corresponding through-hole 12*bi* in the lower plate 12. Thereafter, the IC socket is fixed to the mounting surface of the printed wiring board 18. At that time, the contact point of the board side plunger 36B is forced into the through-hole 12*bi* in the lower plate 12 against the biasing force of the spring portion 36D by the contact pad on the printed wiring board 18. Then, when the semiconductor device DV is positioned and attached to the inner peripheral portion of the semiconductor device mounting portion 10A, with the contact points 36*ap* of the device side plunger 36A coming into contact with the electrode portion DVb of the semiconductor device DV, part of the device side plunger 36A is pushed into the through-hole 10*bi* in the probe accommodating portion 10B. At that time, since the pair of contact pieces 36C1 and 36C2 of the support stem 36C come into sliding contact at the given pressure with the inner peripheral portion of the small-diameter portion of the device side plunger 36A, the contact points 36*ap* of the device side plunger 36A are electrically connected to the electrode portion DVb, and the contact point of the board side plunger 36B is electrically connected to the contact pad, each at the shortest distance along the center axis of the support stem 36C. Hereby, the inspection probe 36Ai can reliably and stably reduce a resistance value of a transmission path to transmit an electric signal. In addition, since the inspection probe 36Ai as a whole is supported by the support stem 36C, the spring portion 36D is prevented from buckling. Furthermore, the inspection probe 36Ai is suitable for large-current use.

Moreover, the example of the inspection probe 36Ai according to the present invention is integrally formed from a copper alloy material as a non-magnetic metal, and its surface is subjected to the plating process with a non-magnetic metal. Since an iron-based magnetic material such as a piano wire or a stainless steel wire has conventionally been used as a coil spring material to meet demands for load bearing, durability, and the like, an inspection probe using the iron-based magnetic material cannot be used in an apparatus for inspecting a magnetic sensor such as an acceleration sensor and a gyro sensor, for example, because the inspection probe generates a magnetic field that impedes the inspection. This example can also solve this problem which the inspection probe using the iron-based magnetic material cannot be used in the apparatus.

In order to manufacture the above-described inspection probe 36Ai, blanks 46 are integrally formed in the first place as shown in the enlarged view of FIG. 9B by blanking out a thin sheet material made of a copper alloy while using a given die. Note that FIG. 9B typically illustrates one blank 46 out of the multiple blanks formed at the same time.

Each blank 46 comprises: a portion 46D corresponding to the spring portion 36D, which connects a portion 46A and a portion 46B corresponding to the board side plunger 36B, the portion 46A corresponding to the device side plunger 36A of the inspection probe 36Ai; and a portion 46C corresponding to the support stem 36C, which is joined to the portion 46B through a connection piece 46Ct. An indented end portion 46ap that constitutes the contact points 36ap of the device side plunger 36A is formed at one end of the portion 46A. In addition, an expanded portion 46ad that forms the large-diameter portion is formed at the other end of the portion 46A.

The portion 46D has curved portions 46D1 to 46D9 which are connected together and correspond to the curved portions 36D1 to 36D9, respectively. One end of the portion 46B is connected to the curved portion 46D5 while the other end portion thereof is connected to one end of the connection piece 46Ct. The other end of the elongated connection piece 46Ct is connected to the portion 46C. An opposite end portion of the portion 46C is provided with a pair of projecting pieces 46C1 and 46C2 at a given clearance in between, which constitute the pair of contact pieces 46C1 and 46C2.

Next, as in the above-described example, the flat portion 46C is rolled into a cylindrical shape and is formed into a cylindrical portion that becomes the support stem. Hereby, the pair of projecting pieces 46C1 and 46C2 face each other.

Subsequently, as in the above-described example, the connection piece 46Ct is folded together with the cylindrical portion in such a manner that the connection piece 46Ct overlaps the portion 46B. Herewith, the support stem is formed in such a manner as to intersect and overlap the curved portions 46D1 to 46D9 of the portion 46D.

Then, as in the above-described example, the portion 46A and the portion 46D are bent into an elongated cylindrical shape. Here, the curved portions 46D1 to 46D9 of the portion 46D are wound around an outer peripheral portion of the support stem with a predetermined clearance in between. Hereby, the inspection probe 36Ai is obtained in the shape as shown in FIG. 9A.

Moreover, in the example shown in FIG. 10A, an inspection probe 56Ai comprises: a device side plunger 56A serving as a first plunger having contact points that selectively come into contact with the electrode portion DVb of the semiconductor device DV; a board side plunger 56B having a contact point that selectively comes into contact with the contact pad of the above-described printed wiring board 18; a spring portion 56D which biases the device side plunger 56A and the board side plunger 56B in a direction away from each other; and a cylindrical support stem 56C being disposed inside the spring portion 56D, making the spring portion 56D slidable thereon, and being configured to retain straight advancing property of the spring portion 56D.

The inspection probe 56Ai is integrally formed from a thin sheet material made of a copper alloy as a non-magnetic metal and in accordance with a series of press working processes. The thin sheet material made of a copper alloy may be phosphor bronze or beryllium copper, for example. After the formation, the inspection probe 16Ai undergoes a plating process using one or more metals or an alloy of the metals selected from a group of non-magnetic metals. The group of non-magnetic metals includes gold, silver, copper, palladium, rhodium, iridium, and platinum, for example. The plating process is performed, for example, in such a way as to form a first layer of copper in a film thickness of 0.05 to 1 μm on a surface of a base metal made of a copper alloy, and then to stack a second layer of gold in a film thickness of 0.1 to 5 μm on the first layer. Note that the plating process is not limited only to the foregoing example. For instance, only a single layer of gold may be formed in a film thickness of 0.1 to 5 μm on a surface of a base metal made of a copper alloy.

As shown in FIG. 10A, the device side plunger 56A is shaped like a different diameter pipe, and one end thereof includes four contact points 56ap which are pointed projections located on a common circumference. The cylindrical device side plunger 56A includes a small-diameter portion whose one end is provided with the above-described contact points 56ap, and a large-diameter portion which is continuous with the small-diameter portion and located on an inner side. The small-diameter portion and the large-diameter portion communicate with each other. A stepped portion 56ad is formed in an outer peripheral portion of the device side plunger 56A corresponding to a boundary between the small-diameter portion and the large-diameter portion. The stepped portion 56ad is engaged with the stepped portion of the through-hole 10bi in the probe accommodating portion 10B described above when the inspection probe 56Ai is attached into the through-hole 10bi in the housing 10 of the IC socket described above. An end portion of the large-diameter portion of the device side plunger 56A is integrally connected to an end of a curved portion 56D1 of the spring portion 56D.

The board side plunger 56B serving as a second plunger is shaped like a different diameter pipe, and one end thereof includes a contact point formed like a double pipe. The board side plunger 56B includes a small-diameter portion whose outer peripheral portion on one end is provided with the above-described spherical contact point, and a large-diameter portion which is continuous with the small-diameter portion and located on an inner side. A stepped portion 56bd is formed in an outer peripheral portion of the board side plunger 56B corresponding to a boundary between the small-diameter portion and the large-diameter portion. The stepped portion 56bd is engaged with the stepped portion of the through-hole 12bi in the lower plate 12 described above when the inspection probe 56Ai is attached into the through-hole 10bi. An end portion of the large-diameter portion of the board side plunger 56B is integrally connected to an end of a curved portion 56D5 of the spring portion 56D.

The cylindrical support stem 56C is disposed between the inside of the large-diameter portion of the device side plunger 56A and the inside of the large-diameter portion as well as the small-diameter portion of the board side plunger 56B. One end of the support stem 56C has a pair of contact pieces 56C1 and 56C2 that face each other with a given clearance in between. Each of the pair of contact pieces 56C1 and 56C2 has a substantially semicircular cross-sectional shape and is made elastically displaceable in a radial direction of the support stem 56C. A diameter Da of contact pieces 56C1 and 56C2 is set to a diameter smaller than a diameter of an intermediate portion of the support stem 56C, for example, and to come into slidably contact at a given pressure with an inner peripheral portion of the small-diameter portion of the device side plunger 56A. As described later, by swaging the large-diameter portion and the small-diameter portion of the board side plunger 56B, the other end of the support stem 56C is fitted into the large-diameter portion and the small-diameter portion of the board side plunger 56B.

The helical spring portion 56D is wound with a predetermined clearance around an outer peripheral portion of the support stem 56C. The center axis of the spring portion 56D substantially coincides with the center axis of the support stem 56C. The predetermined clearance is set in such a manner as to retain straight advancing property of the sliding spring portion 56D as described later. The spring portion 56D includes curved portions 56D1, 56D2, 56D3, 56D4, 56D5, 56D6, 56D7, 56D8, and 56D9, which are connected together and arranged in a staggered manner along the center axis of the support stem 56C. Thus, a bent part of the curved portion 56D6 is formed between the curved portion 56D1 and the curved portion 56D2 with predetermined intervals. A bent part of the curved portion 56D2 is formed between the curved portion 56D6 and the curved portion 56D7 with predetermined intervals. At that time, a width of a bent part of the curved portion 56D1 is formed to change to a larger extent than a width of the remaining part thereof. Similarly, a width of a bent part of each of the curved portions 56D2 to 56D9 is formed to change to a larger extent than a width of the remaining part thereof. Herewith, the bent parts having the relatively larger widths are formed substantially on a straight line along the center axis of the support stem 56C.

At that time, the curved portions 56D1 to 56D9 are formed to be capable of coming close to and moving away from one another in response to movements of the device side plunger 56A and the board side plunger 56B. Accordingly, the spring portion 56D is made expandable and contractible along the center axis of the support stem 56C, and is configured to bias the device side plunger 56A and the board side plunger 56B in the direction away from each other.

Although the above-described spring portion 56D includes the nine curved portions, the present invention is not limited only to this example, for instance, the number of the curved portions may be increased or decreased in accordance with contact pressures deemed to be necessary for the contact points of the device side plunger 56A and the board side plunger 56B. Alternatively, the shape of each curved portion may be changed.

In the above-described configuration, each inspection probe 56Ai is attached into one of the multiple through-holes 10bi in the probe accommodating portion 10B of the housing 10 and into the corresponding through-hole 12bi in the lower plate 12. Thereafter, the IC socket is fixed to the mounting surface of the printed wiring board 18. At that time, the contact point of the board side plunger 56B is forced into the through-hole 12bi in the lower plate 12 against the biasing force of the spring portion 56D by the contact pad on the printed wiring board 18. Then, when the semiconductor device DV is positioned and attached to the inner peripheral portion of the semiconductor device mounting portion 10A, with the contact points 56ap of the device side plunger 56A coming into contact with the electrode portion DVb of the semiconductor device DV, part of the device side plunger 56A is pushed into the through-hole 10bi in the probe accommodating portion 10B. At that time, since the pair of contact pieces 56C1 and 56C2 of the support stem 56C come into sliding contact at the given pressure with the inner peripheral portion of the small-diameter portion of the device side plunger 56A, the contact points 56ap of the device side plunger 56A are electrically connected to the electrode portion DVb, and the contact point of the board side plunger 56B is electrically connected to the contact pad, each at the shortest distance along the center axis of the support stem 56C. Hereby, the inspection probe 56Ai can reliably and stably reduce a resistance value of a transmission path to transmit an electric signal. In addition, since the inspection probe 56Ai as a whole is supported by the support stem 56C, the spring portion 56D is prevented from buckling. Furthermore, the inspection probe 56Ai is suitable for large-current use.

Moreover, the example of the inspection probe 56Ai according to the present invention is integrally formed from a copper alloy material as a non-magnetic metal, and its surface is subjected to the plating process with a non-magnetic metal. Since an iron-based magnetic material such as a piano wire or a stainless steel wire has conventionally been used as a coil spring material to meet demands for load bearing, durability, and the like, an inspection probe using the iron-based magnetic material cannot be used in an apparatus for inspecting a magnetic sensor such as an acceleration sensor and a gyro sensor, for example, because the inspection probe generates a magnetic field that impedes the inspection. This example can also solve this problem which the inspection probe using the iron-based magnetic material cannot be used in the apparatus.

Figure 10B:
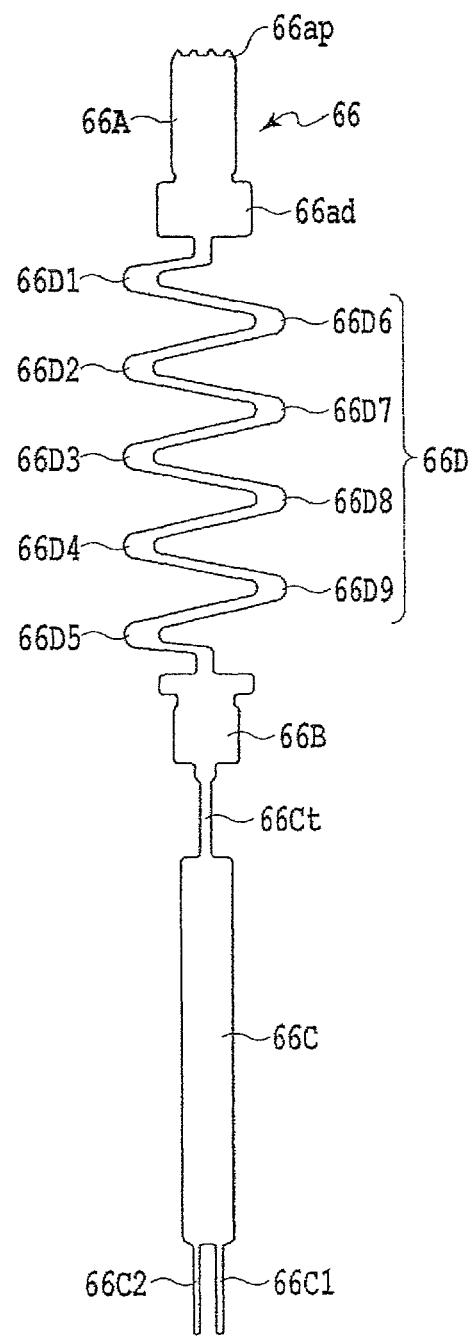
FIG. 10B is a view showing a blank used for formation of the example shown in FIG. 10A.

In order to manufacture the above-described inspection probe 56Ai, blanks 66 are integrally formed in the first place as shown in the enlarged view of FIG. 10B by blanking out a thin sheet material made of a copper alloy while using a given die. Note that FIG. 10B typically illustrates one blank 66 out of the multiple blanks formed at the same time.

Each blank 66 comprises: a portion 66D corresponding to the spring portion 56D, which connects a portion 66A and portion 66B corresponding to the board side plunger 56B, the portion 66A corresponding to the device side plunger 56A of the inspection probe 56Ai; and a portion 66C corresponding to the support stem 56C, which is joined to the portion 56B with a connection piece 66Ct. An indented end portion 66ap that constitutes the contact points 56ap of the device side plunger 56A is formed at one end of the portion 66A. In addition, an expanded portion 66ad that constitutes the large-diameter portion is formed at the other end of the portion 66A.

The portion 66D has curved portions 66D1 to 66D9 which are connected together and correspond to the curved portions 56D1 to 56D9, respectively. One end of the portion 66B is connected to the curved portion 66D5 while the other end portion thereof is connected to one end of the connection piece 66Ct. The other end of the elongated connection piece 66Ct is connected to the portion 66C. An opposite end portion of the portion 66C is provided with a pair of projecting pieces 66C1 and 66C2 at a given clearance in between, which constitute the pair of contact pieces 66C1 and 66C2.

Next, as in the above-described examples, the flat portion 66C is rolled into a cylindrical shape and is formed into a cylindrical portion that becomes the support stem. Herewith, the pair of projecting pieces 66C1 and 66C2 face each other.

Subsequently, as in the above-described examples, the connection piece 66Ct is folded together with the cylindrical portion in such a manner that the connection piece 66Ct overlaps the portion 66B. Herewith, the support stem is formed in such a manner as to intersect and overlap the curved portions 66D1 to 66D9 of the portion 66D.

Then, as in the above-described examples, the portion 66A and the portion 66D are bent into an elongated cylindrical shape. At that time, the curved portions 66D1 to 66D9 of the portion 66D are wound around an outer peripheral portion of the support stem with a predetermined clearance in between. Hereby, the inspection probe 56Ai is obtained in the shape as shown in FIG. 10A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An inspection probe comprising:
a first plunger formed from a copper alloy material, and having a contact point configured to selectively come into contact with an electrode portion of an object to be inspected;
a second plunger formed from the copper alloy material, and having a contact point configured to selectively come into contact with an electrode portion of a wiring board;
a spring portion formed integrally with one end of the first plunger and a first end of the second plunger, the spring portion being configured to bias the first plunger and the second plunger in a direction away from each other; and
a support stem formed into a cylindrical shape integrally with the contact point of a second end of the second plunger, the second end being opposite to the first end, the support stem extending from the second end and being folded back toward the first end in such a manner as to be disposed inside the spring portion with a predetermined clearance in between, and configured to slidably guide the spring portion, wherein
when the contact point of the first plunger comes into contact with the electrode portion of the object to be inspected, one end of the support stem inserted into an inner peripheral portion of the first plunger comes into sliding contact with the inner peripheral portion of the first plunger.

2. The inspection probe according to claim 1, wherein another end of the support stem having a pair of elastic contact pieces on the one end of the support stem, forms the contact point of the second plunger.

3. The inspection probe according to claim 2, wherein the contact point of the second plunger is spherical.

4. The inspection probe according to claim 1, wherein the predetermined clearance between an inner peripheral portion of the spring portion and an outer peripheral portion of the support stem is set in such a manner as to retain straight advancing property of the spring portion.

5. The inspection probe according to claim 1, wherein a cross-sectional shape of the spring portion along a longitudinal section of the support stem is formed into a rectangular shape.

6. The inspection probe according to claim 1, wherein the contact point of the first plunger comprises at least three projections located on a common circumference.

7. The inspection probe according to claim 1, wherein the first plunger, the second plunger, the spring portion, and the support stem are formed by subjecting a common plate-shaped blank to bending work.

8. An IC socket comprising:
a plurality of the inspection probes according to claim 1; and
a housing being disposed on a wiring board to be electrically connected to the inspection probes, having
a probe accommodating portion configured to accommodate the inspection probes, and
a semiconductor device mounting portion configured to attachably and detachably accommodate a semiconductor device provided with a plurality of the electrode portions with which the contact points of the inspection probes come into contact.

9. An inspection probe comprising:
a first plunger formed from a copper alloy material, and including a contact point configured to selectively come into contact with an electrode portion of an object to be inspected;
a second plunger formed from the copper alloy material, and having a contact point configured to selectively come into contact with an electrode portion of a wiring board;
a spring portion formed integrally with one end of the first plunger and a first end of the second plunger, the spring portion being configured to bias the first plunger and the second plunger in a direction away from each other; and
a support stem formed into a cylindrical shape integrally with the contact point of a second end of the second plunger, the second end being opposite to the first end, the support stem extending from the second end and being folded back toward the first end in such a manner as to be disposed inside the spring portion with a predetermined clearance in between, and configured to slidably guide the spring portion, wherein
when the contact point of the first plunger comes into contact with the electrode portion of the object to be inspected, one end of the support stem inserted into an inner peripheral portion of the first plunger comes into sliding contact with the inner peripheral portion of the first plunger, and
the first plunger, the second plunger, and the spring portion are shaped by subjecting a common plate-shaped blank made of the copper alloy to bending work and then to a plating process with a non-magnetic metal.

10. The inspection probe according to claim 9, wherein the non-magnetic metal includes at least gold or copper.

11. The inspection probe according to claim 9, wherein the plating process is performed in such a way as to form a first layer of copper in a film thickness of 0.05 to 1 µm on a surface of a base metal made of the copper alloy, and then to stack a second layer of gold in a film thickness of 0.1 to 5 µm on the first layer.

12. The inspection probe according to claim 9, wherein the plating process is performed in such a way as to form only a single layer of gold in a film thickness of 0.1 to 5 µm on a surface of a base metal made of the copper alloy.

13. An IC socket comprising:
a plurality of the inspection probes according to claim 9; and
a housing being disposed on a wiring board to be electrically connected to the inspection probes, having
a probe accommodating portion configured to accommodate the inspection probes, and
a semiconductor device mounting portion configured to attachably and detachably accommodate a semiconductor device provided with a plurality of the electrode portions with which the contact points of the inspection probes come into contact.

* * * * *